United States Patent [19]

Nowell

[11] 4,360,782
[45] Nov. 23, 1982

[54] MAXIMUM FREQUENCY DETECTOR

[75] Inventor: John R. Nowell, Phoenix, Ariz.

[73] Assignee: Honeywell Information Systems Inc., Phoenix, Ariz.

[21] Appl. No.: 191,117

[22] Filed: Sep. 26, 1980

[51] Int. Cl.³ .......................... H03K 5/26; H03K 3/78
[52] U.S. Cl. .................................... 328/140; 328/138; 307/523
[58] Field of Search ....................... 307/519, 522, 523; 328/140, 141, 138

[56] References Cited

U.S. PATENT DOCUMENTS

| | | | |
|---|---|---|---|
| 4,002,989 | 1/1977 | Cardon et al. | 328/138 |
| 4,021,794 | 5/1977 | Carlson | 328/138 X |
| 4,024,414 | 5/1977 | Gurry | 307/523 |
| 4,085,373 | 4/1978 | McConnell | 328/141 |
| 4,232,267 | 11/1980 | Hanajima et al. | 328/138 |

Primary Examiner—John S. Heyman
Attorney, Agent, or Firm—Lockwood D. Burton; Wm. W. Holloway, Jr.; L. J. Marhoefer

[57] ABSTRACT

A maximum frequency detector having a counter which counts through a certain number of counts unless an inhibit signal is received at a rate determined by the frequency of the clock pulse received. The inhibit signal is generated by a logic network to prevent the counter from producing an outgoing digital pulse of the digital pulse stream. The counter, the clock pulse generator and the logic network cooperate to have the frequencies of the incoming and outgoing digital pulses equal unless the incoming digital pulse stream has its frequency exceed the predetermined maximum frequency. In the event that the frequency of the incoming digital pulse stream exceeds the predetermined maximum frequency the frequency of the outgoing digital pulse stream is the certain predetermined maximum frequency.

10 Claims, 2 Drawing Figures

MAXIMUM FREQUENCY DETECTOR

BACKGROUND OF THE INVENTION

1. Field of the Invention

This invention relates to a maximum frequency detector for limiting the frequency of a digital pulse stream to a certain predetermined maximum frequency, and, more particularly, this invention relates to a maximum frequency detector for limiting the frequency of a digital pulse stream to a certain predetermined maximum frequency by utilization of a counter for preventing the frequency of the digital pulse stream from exceeding the certain predetermined maximum frequency.

2. Description of the Prior Art

Reference is made to U.S. Pat. No. 4,045,887 issued to Nowell on Sept. 6, 1977, and entitled "Switching Regulator Control Circuit". In the Nowell patent, it is desired to control the maximum frequency of a digital pulse stream which is in turn utilized to control the firing rate of a plurality of silicon controlled rectifiers (hereinafter referred to as SCR). The switching regulator, which includes the SCRs, is utilized to convert an unregulated DC voltage to a regulated DC output. It is desirable that, in order not to cause failure of the SCRs, each SCR be allowed to fully recover after firing (i.e., actuation). Therefore, the maximum frequency at which pulses are applied to the firing circuits connected to each SCR must not exceed a certain predetermined maximum frequency. This maximum frequency is approximately equal to the recovery time of the SCR divided by the number of SCRs within the switching regulator circuit. The SCRs are fired in a certain predetermined sequence. The control of the maximum frequency as shown in the Nowell patent is accomplished by allowing the clock generator 100 (FIG. 3) to vary only within a certain limited range in response to the output voltage of the switching regulator circuit.

It has been found in certain applications that a wide range of frequencies is highly desirable. It is also desirable to fire the SCR immediately after recovery when the switching regulator circuit is at 100 percent of the rated load. Therefore, it is desired that very accurate control over the maximum frequency of the digital pulse stream be maintained.

None of the prior constructions of maximum frequency detectors for limiting the maximum frequency of the digital pulse stream produced as known in the art utilizes a counter which prevents the digital pulse stream from exceeding the predetermined maximum frequency.

SUMMARY OF THE INVENTION

The present invention comprises a clock pulse generator, a counter, and a logic network. The clock generator, counter, and logic network cooperate to limit the frequency of the digital pulse stream received to a certain predetermined maximum frequency. The counter is connected to receive the output of the clock pulse generator for counting each of the clock pulses. The counter is connected to count through a certain number of counts, for example, from 0 to 15 and then recycling to 0 and proceeding to count therefrom. Thus, the counter is capable of counting each pulse and continuously recycling through the certain number of counts unless it receives an inhibit signal. The counter advances to the next count when the clock pulse makes a transition from low to high. At a particular count, one output of the counter goes from low to high and remains high until the counter advances to the next count. At this particular count another output of the counter goes low when the clock pulse goes low unless the inhibit signal is received. Both of these signals generated by the counter are connected to the logic network. The signal which goes high at the particular count is connected to an AND gate which generates the inhibit signal. The other signal of the counter is connected to the reset input of a flip flop. This flip flop receives the incoming digital pulse stream at its clock input. When the output of the counter connected to the reset input of the flip flop goes low the Q output of the flip flop goes high. The output of the flip flop is connected through a NAND gate to the data input of a second flip flop. The clock input of the second flip flop is connected to receive the clock pulses from the clock pulse generator at its clock input. The Q output of the flip flop is connected to the AND gate which produces the inhibit signal. The outgoing digital pulse stream which has its maximum frequency limited to the predetermined maximum frequency is the signal which is also connected to the reset input of the first flip flop.

The logic network can be any logic network which produces the desired result of producing an inhibit signal if the counter reaches the particular count prior to the network receiving a pulse of the digital pulse stream. The logic network must also cease to produce the inhibit signal when the next pulse of the digital pulse stream is received. When the output of the counter which is connected to the reset input of the first flip flop goes high, this forms the next pulse in the outgoing digital pulse stream. The logic network must not produce the inhibit signal if the digital pulse of the digital pulse stream is received prior to the counter reaching the particular count discussed above.

It is an advantage of the particular invention to provide a frequency limited digital pulse stream which is sensitive to the frequency of the incoming digital pulse so that the frequency of the outgoing digital pulse stream is equal to the frequency of the incoming digital pulse stream unless the incoming digital pulse stream exceeds the preselected maximum frequency.

DESCRIPTION OF THE PREFERRED EMBODIMENT

Figure 1:
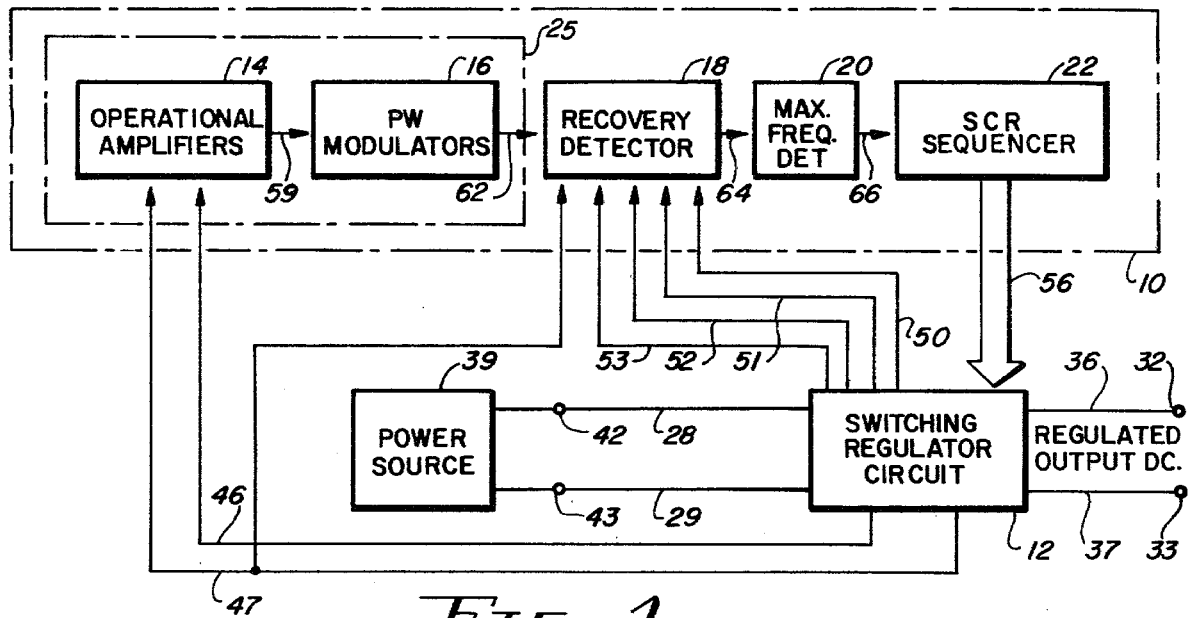
FIG. 1 shows a control circuit for a switching regulator circuit which utilizes the maximum frequency detector of the present invention.

With reference to the drawings and in particular to FIG. 1 thereof, a control apparatus 10 is connected to a switching regulator circuit 12. The control apparatus 10 includes an operational amplifier 14, a pulse width modulator 16, a recovery detector 18, a maximum frequency detector 20, and an SCR sequencer 22. Operational amplifier 14 and pulse width modulator 16 comprise a voltage control oscillator 25. Switching regulator circuit 12 receives an unregulated DC input through lines 29 and 28 of some appropriate voltage. The particular environment of the control circuit and the switching regulator circuit as shown in FIG. 1 are by way of example only and the maximum frequency detector 20 can be utilized in any environment in which it is desirable to accurately limit the frequency of the digital pulse stream to a certain predetermined maximum frequency.

Switching regulator circuit 12 supplies a regulated DC voltage at its output terminals 32 and 33 through lines 36 and 37, respectively. In other words, the regulated DC output on output terminals 32 and 33 represents a certain regulated potential difference therebetween. A power source 39 is connected through terminals 42 and 43 to lines 28 and 29, respectively, to provide the required unregulated DC power to switching regulator circuit 12.

Operational amplifier 14 is connected to the output voltage present on lines 36 and 37 and, therefore, to the output terminals 32 and 33 through lines 46 and 47, respectively. The switching regulator circuit 12 is connected through lines 50 through 53 to recovery detector 18. The recovery detector 18 is also connected to the switching regulator circuit 12 through line 47.

The SCR sequencer 22 provides gating pulses to each of the SCRs within the switching regulator circuit 12 through multiline channel 56. The function of control apparatus 10 and switching regulator circuit 12 is described in more detail in the copending applications Ser. Nos. 191,112 and 191,111 by Nowell and entitled "Control Apparatus for Switching Regulator Circuit" and "Voltage Controlled Oscillator", which are incorporated by reference hereinto. Also incorporated by reference hereinto is the more detailed descriptions of the general functioning of switching regulator circuits as described in U.S. Pat. No. 4,142,231 issued to Wilson et al. on Feb. 27, 1979, and entitled "High Current Low Voltage Liquid Cooled Switching Regulator DC Power Supply" and U.S. Pat. No. 4,045,887 issued to Nowell on Sept. 6, 1977, and entitled "Switching Regulator Control Circuit".

Within control circuit 10 the output of operational amplifier 14 is connected through line 59 to pulse width modulator 16. The output of pulse width modulator 16, which comprises a digital pulse stream, is connected to recovery detector 18 through line 62. The output of recovery detector 18 is connected through line 64 as an input to the maximum frequency detector 20. The input to SCR sequencer 22 is connected through line 66 to the output of maximum frequency detector 20. Lines 62, 64 and 66 carry the digital pulse stream.

The locations of the recovery detector 18 and the maximum frequency detector 20 can be reversed as desired so that the maximum frequency detector 20 receives the output of pulse width modulator 16 and recovery detector 18 receives as its input the output of maximum frequency detector 20. Recovery detector 18 can then have its output connected as an input to SCR sequencer 22.

Lines 46 and 47 which sense the output of voltage of switching regulator circuit 12 can be connected to the output terminals 32 and 33 of switching regulator circuit 12 as shown in U.S. patent application Ser. No. 80,642 by Genuit, filed on Nov. 1, 1979, and entitled "Switching Regulator Circuit", which is incorporated hereinto by reference. The SCR sequencer 22 provides gating impulses to each of the individual SCRs located within switching regulator circuit 12 through multiline channel 56. A more detailed discussion of the general operation of the control circuit 10 and the switching regulator circuit 12 can be found in the copending application by Nowell entitled "Control Apparatus for Switching Regulator Circuit". The voltage control oscillator is required to operate stably over a wide range of frequencies because of the varying loads being applied to the switching regulator circuit 12. Utilizing the voltage controlled oscillator as described herein it is possible to operate the switching regulator circuit with loads varying from 1% to 100% of the maximum load. However, it is desirable to precisely limit the maximum frequency of the digital pulse stream to a frequency which allows each of the SCRs to fully recover before a gating pulse is applied by SCR sequencer 22 thereto. The preciseness is desirable because the SCRs should at 100% load of the switching regulator circuit 12 be operated to allow a gating pulse from SCR sequencer 22 to be applied to each SCR immediately after that SCR has fully recovered from the prior gating pulse. Each SCR is fired by the application of the gating pulse from SCR sequencer 22 in a known predetermined sequence.

Figure 2:
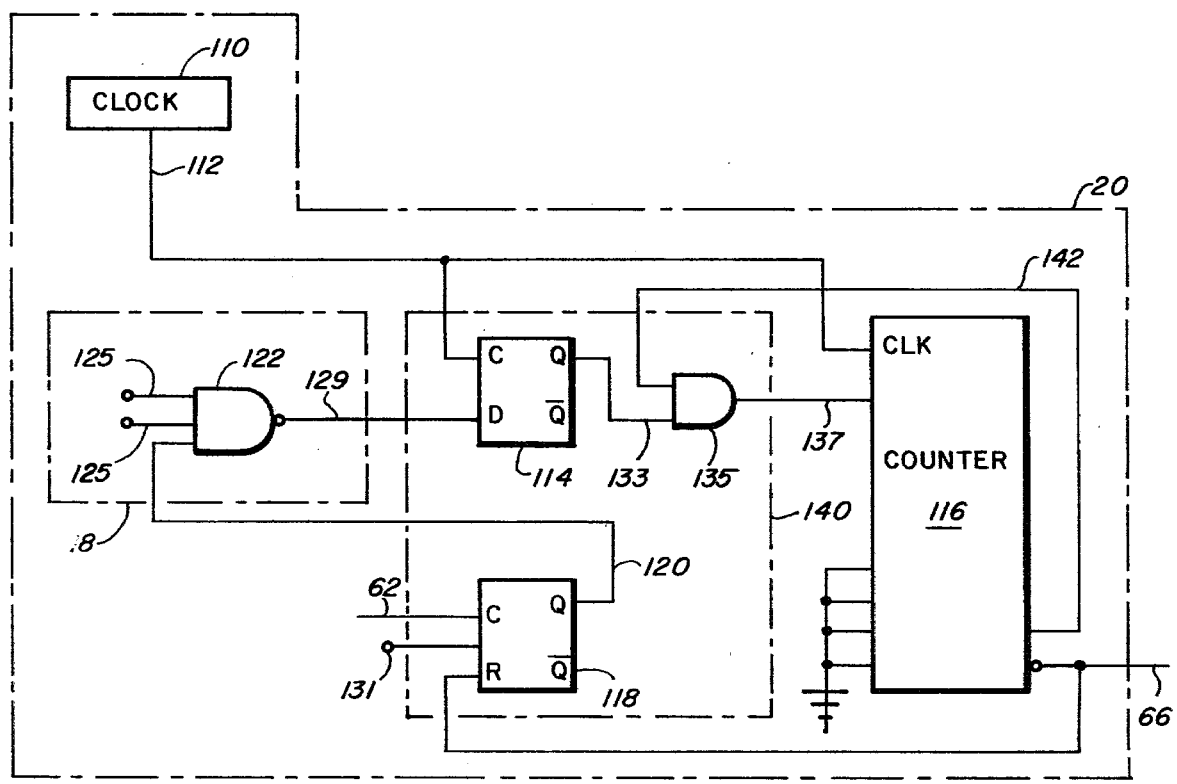
FIG. 2 is a block diagram of the clock pulse generator, counter, and logic network of the present invention.

The maximum frequency detector 20 is discussed in more detail in connection with the block diagram of FIG. 2. As shown in FIG. 2, a clock pulse generator 110 is connected through line 112 as an input to the clock inputs of flip flop 114 and counter 116. Counter 116 can be of the type designated as 74LS191. The output of clock pulse generator 110 comprises a plurality of clock pulses having a known stable preselected frequency. The incoming digital pulse stream is received by maximum frequency detector 20 through line 62 as an input to the clock input of a flip flop 118. The Q output of flip flop 118 is connected through line 120 as an input to NAND gate 122. NAND gate 122 is a portion of recovery detector 18. The block diagram of FIG. 1 shows that the output of voltage controlled oscillator 25 is connected through line 62 directly to recovery detector 18. However, in FIG. 2, line 62 is connected to maximum frequency detector because the particular arrangement of logic devices requires this relationship.

In the particular embodiment of the present invention shown in FIG. 2, line 62 is connected to flip flop 118 of maximum frequency detector 20 and the output of flip flop 118 through line 120 is connected to NAND gate 122 of recovery detector 18. NAND gate 122 also receives inputs from other portions of recovery detector 18 through lines 125 and 126. The function of these lines is more fully discussed in the copending applications by Nowell which are incorporated by reference above. The output of NAND gate 122 is connected through line 129 to the data input of flip flop 114 within maximum frequency detector 20. The data input of flip flop 118 is connected to a high signal on terminal 131. The Q output of flip flop 114 is connected through line 133 to an input of AND gate 135. The output of AND gate 135 is an inhibit signal connected to the inhibit input of counter 116 through line 137. AND gate 135 and flip flops 114 and 118 and their interconnected lines comprise a logic network 140.

The arrangement of logic 140 can be varied as long as the inhibit signal produced on line 137 provides the same control over the output of counter 116 to line 66 as discussed herebelow. In other words, the particular arrangement of logic elements within logic network 140 can be varied, for example, the Q output of flip flop 118 could be connected through an inverter directly to the data input of flip flop 114 or the not Q output of flip flop 118 could be connected directly to the data input of flip flop 114, if the recovery detector is eliminated or connected in a different manner. Further, negative logic rather than positive logic or combinations thereof could be utilized throughout the maximum frequency detector 20. Counter 116 has its maximum/minimum output connected through line 142 as the other input to AND gate 135. The output of counter 116 has its output to the maximum/minimum output connected to line 142 normally low. The maximum/minimum output goes high only when a particular count within counter 116 is reached. If counter 116 is counting up when its output reaches a count of 15, the output of counter 116 to line 142 goes high. Counter 116 counts each of the clock pulses on line 112 from clock pulse generator 110 as the clock pulse causes a low to high transition. Thus, the first low to high transition on line 112 after the counter has reached a count of 14 causes the count to change to 15 and the output of counter 116 to line 142 goes high. Counter 116 is connected so that each low to high transition of clock pulse generator 110 causes it to advance one count up to a maximum of 15 and to recycle to a count of 0 and continue to count, unless an inhibit signal from AND gate 135 is present. A high output from AND gate 135 causes counter 116 to cease counting until the output of AND gate 135 goes low.

The output of counter 116 to line 66 is connected to SCR sequencer 22 and the reset input of flip flop 118. The output of counter 116 to line 66 is normally high and goes low only when the particular count which causes the output to line 142 to go high is the current count within counter 116, the output of clock 110 is low, and the output of AND gate 135 is low. A low signal to the reset input of flip flop 118 causes its output to the Q output connected to line 120 to go low.

The frequency of the clock pulse generator 110 as shown herein must equal the predetermined maximum frequency for the digital pulse stream times the number of counts through which counter 116 cycles, which in this example is 16. Various implementations of the logic network 140 can produce delays in the application of the inhibit signal to counter 116. In this event the frequency of the clock pulse generator 110 would be adjusted to compensate for any delays within logic network 140 in the removal of the inhibit signal from counter 116. Counter 116 can be adapted to count up or down although as discussed above in this particular implementation of the present invention counter 116 counts up.

In operation, assuming that the output of AND gate 135 is low and the Q output of flip flop 118 is low, when a digital pulse, i.e., a low to high transition, occurs on line 62, the output of flip flop 118 goes high and therefore the output of NAND gate 122 goes low. It is assumed that high signals are present on lines 125 and 126. During the next low to high transition of the clock pulse on line 112 the output of flip flop 114 to line 133 goes low. When counter 116 has its output to line 142 go high, the output of AND gate 135, because of the low signal on line 133, remains low. Thus, the output of counter 116 to line 66, when the clock pulse on line 112 goes low, goes low. As discussed above the output of counter 116 to line 66 goes low only when a particular count, 15, is reached within counter 116, the output of AND gate 135 to line 137 is low and the clock pulse on line 112 is low. Thus, if line 133 goes low which means a digital pulse of the digital pulse stream was received, counter 116 reaches a count of 15 and its output to line 66, which is the outgoing digital pulse stream, goes low when the clock pulse goes low and high when the clock pulse goes high. This low to high transition is interpreted by SCR sequencer 22 as a digital pulse, and it in a known sequence provides a gating pulse to one of the SCRs within switching regulator circuit 12 (FIG. 1). Thus, the low to high transitions on line 66 can only occur after counter 116 has counted through all of its certain number of counts which in example shown in FIG. 2 is 16 counts.

After the output of counter 116 to line 66 goes low, flip flop 118 responds to the low signal at its reset input by causing its output to line 120 to go low. This low output causes the output of AND gate 122 to go high and the Q output during the next low to high transition of the clock pulse on line 112 has its Q output go to line 133 go high. When counter 116 again reaches a count off 15, the output to line 142 from counter 116 goes high and AND gate 135 has its output go high because both of its inputs are high. The high signal from AND gate 135 to line 137 prevents the output of counter 116 to line 66 from going low during the next low portion of the clock pulses on line 112. When the next pulse of the digital pulse stream is received on line 62, i.e., a low to high transition occurs the output of flip flop 118 to line 120 goes high. The output of NAND gate 122 in turn goes low, and during the next low to high transition the clock pulse on line 112 the output of flip flop 114 to line 133 goes low. The output of AND gate 135 then goes low. When the clock pulse on line 112 goes low, the output of counter 116 to line 66 goes low. The operation of the maximum frequency detector continues as discussed above.

Thus, the outgoing digital pulse stream on line 66 is limited to a certain predetermined maximum frequency as determined by clock generator 110 and the cycling of counter 116 through its certain number of counts. Maximum frequency detector 20 allows the frequency of the digital pulse stream on line 62 to be transferred to the outgoing digital pulse stream on line 66 without alteration unless the incoming digital pulse stream on line 62 has its frequency exceed the predetermined maximum frequency. In the event that the incoming digital pulse stream has its frequency exceed the certain predetermined maximum frequency the output of counter 116 to line 66 is the certain predetermined maximum frequency. When the frequency of the incoming digital pulse stream on line 62 decreases to below that of the certain predetermined maximum frequency the outgoing digital pulse stream on line 66 is the frequency of the incoming digital pulse stream on line 62.

Whereas the present invention has been described in particular relation to the drawings attached hereto, it should be understood that other and further modifications, apart from those shown or suggested herein, may be made within the spirit and scope of this invention.

What is claimed is:

1. A maximum frequency detector for preventing the variable frequency of a digital pulse stream from exceeding a predetermined maximum frequency, comprising:

a. A digital counter producing a first signal at a particular count thereof and a second signal at said particular count in absence of a clock pulse and a third signal, said counter continuously cycling through a certain number of counts in sequence including said particular count at a rate determined by the frequency of a clock pulse unless prevented by receipt of said third signal;

b. A clock connected to provide clock pulses at a certain known frequency to said counter, said certain frequency being said certain number of counts multiplied by said predetermined maximum frequency; and c. A logic network connected to receive said digital pulse stream and said first signal and to produce said third signal after one pulse of said digital pulse stream when said first signal is present to prevent said counter from producing said second signal until the next pulse following said one pulse within said digital pulse stream is received.

2. The maximum frequency detector as set forth in claim 1 wherein said logic network includes an AND gate connected to receive said first signal and a fourth signal for producing said third signal when said first and fourth signals are present.

3. The maximum frequency detector as set forth in claim 2 wherein said logic network includes a first flip flop connected to receive a fifth signal at its data input, to receive said clock pulse at its clock input to produce said fourth signal at its Q output when said fifth signal is present.

4. A maximum frequency detector for preventing the variable frequency of a digital pulse stream from exceeding a predetermined maximum frequency, comprising:

a. A digital counter producing a first signal at a particular count thereof and a second signal at said particular count in absence of a clock pulse and a third signal, said counter continuously cycling through a certain number of counts in sequence including said particular count at a rate determined by the frequency of a clock pulse unless prevented by receipt of said third signal;

b. A clock connected to provide clock pulses at a certain known frequency to said counter, said certain frequency being said certain number of counts multiplied by said predetermined maximum frequency; and c. A logic network connected to receive said digital pulse stream and said first signal and to produce said third signal after one pulse of said digital pulse stream when said first signal is present to prevent said counter from producing said second signal until the next pulse following said one pulse within said digital pulse stream is received, said logic network including an AND gate connected to receive said first signal and a fourth signal for producing said third signal when said first and fourth signals are present, and including a first flip flop connected to receive a fifth signal at its data input, to receive said clock pulse at its clock input to produce said fourth signal signal at its O output when said fifth signal is present, said logic network further including a se flip flop receiving said digital pulse stream at its clock and said second signal at its reset input for producing said fifth signal after said second signal is received until a pulse of said digital pulse stream is received.

5. A maximum frequency detector for preventing the variable frequency of a digital pulse stream from exceeding a predetermined maximum frequency, comprising:

a. A clock generator producing a plurality of clock pulses at a stable certain frequency;

b. A logic network receiving a first signal, said clock pulses, and said digital pulse stream for producing an inhibit signal when said first signal is received prior to receipt of a pulse of said digital pulse stream; and c. A counter operatively connected to produce said first signal at a particular count, to receive said inhibit signal for preventing counting thereby, and to receive said clock pulses for counting thereof, said counter counting said clock pulses a certain number of counts at a known sequence and a recycling through said certain number, said counter providing said first signal at a particular count to one output thereof and a frequency limited pulse to another output at said particular count after a clock pulse when said inhibit signal is absent.

6. A maximum frequency detector as set forth in claim 5 wherein said predetermined maximum frequency is said stable certain frequency divided by said certain number of counts.

7. A maximum frequency detector as set forth in claim 6 wherein said logic network is connected to said another output of said counter to determine when said frequency limited pulse is generated.

8. A maximum frequency detector as set forth in claim 7 wherein said logic network includes a first flip flop connected at its reset input to said another output of said counter and at its clock input to said digital pulse stream.

9. A maximum frequency detector for preventing the variable frequency of a digital pulse stream from exceeding a predetermined maximum frequency, comprising:

a. A clock generator producing a plurality of clock pulses at a stable certain frequency;

b. A logic network receiving a first signal, said clock pulses, and said digital pulse stream for producing an inhibit signal when said first signal is received prior to receipt of a pulse of said digital pulse stream; and c. A counter operatively connected to produce said first signal at a particular count, to receive said inhibit signal for preventing counting thereby, and to receive said clock pulses for counting thereof, said counter counting said clock pulses a certain number of counts at a known sequence and a recycling through said certain number, said counter providing said first signal at a particular count to one output thereof and a frequency limited pulse to another output at said particular count after a clock pulse when said inhibit signal is absent, said predetermined maximum frequency being said stable certain frequency divided by said certain number of counts, said logic network being connected to said another output of said counter to determine when said frequency limited pulse is generated, said logic network including a first flip flop connected at its reset input to said another output of said counter and at its clock input to said digital pulse stream, said logic network further including a second flip flop in electrical communication with the output of said first flip flop and receiving said clock pulses at its clock input for indicating when a digital pulse of said digital pulse stream is absent and said inhibit signal must be generated at said particular count.

10. A maximum frequency detector for preventing variable frequency of a digital pulse stream from exceeding a predetermined maximum frequency, comprising:

a. first means producing a plurality of clock pulses at a certain frequency;

b. a second means connected to said first means to receive said clock pulses for counting each pulse thereof to produce a first signal at a particular count;

c. a third means connected to said second means to produce a second signal at said particular count when said clock pulse is absent;

d. a fourth means receiving said digital pulse stream and said second signal for producing a third signal after said second signal is received until a pulse of said digital pulse stream is received; and e. a fifth means connected to said second means and receiving said first and third signals for inhibiting said second means from counting and producing said second signal if both said first and third signals are simultaneously present.

* * * * *